US009016883B2

(12) United States Patent
Katayama

(10) Patent No.: US 9,016,883 B2
(45) Date of Patent: Apr. 28, 2015

(54) POLARIZED LIGHT EMITTING ELEMENT FOR DISPLAY APPARATUS

(75) Inventor: Ryuichi Katayama, Tokyo (JP)

(73) Assignee: NEC Corporation, Tokyo (JP)

( * ) Notice: Subject to any disclaimer, the term of this patent is extended or adjusted under 35 U.S.C. 154(b) by 288 days.

(21) Appl. No.: 13/580,547

(22) PCT Filed: Mar. 10, 2011

(86) PCT No.: PCT/JP2011/055685
§ 371 (c)(1),
(2), (4) Date: Oct. 11, 2012

(87) PCT Pub. No.: WO2011/111788
PCT Pub. Date: Sep. 15, 2011

(65) Prior Publication Data
US 2013/0021774 A1 Jan. 24, 2013

(30) Foreign Application Priority Data

Mar. 11, 2010 (JP) ................................. 2010-054428

(51) Int. Cl.
A47B 19/00 (2006.01)
H01L 33/46 (2010.01)
H01L 33/58 (2010.01)

(52) U.S. Cl.
CPC .............. H01L 33/465 (2013.01); H01L 33/58 (2013.01)

(58) Field of Classification Search
USPC ...................... 362/19, 268, 98; 257/98, 72, 59
See application file for complete search history.

(56) References Cited

U.S. PATENT DOCUMENTS

2007/0081253 A1 4/2007 Yamauchi
2009/0278954 A1 11/2009 Kanamori et al.

FOREIGN PATENT DOCUMENTS

| CN | 101034736 A | 9/2007 |
| JP | 2001051122 A | 2/2001 |
| JP | 2007109689 A | 4/2007 |
| JP | 2009111012 A | 5/2009 |
| JP | 2009117641 A | 5/2009 |

(Continued)

OTHER PUBLICATIONS

The international search report for PCT/JP2011/055685 dated Apr. 19, 2011.

(Continued)

Primary Examiner — Ismael Negron
(74) Attorney, Agent, or Firm — Sughrue Mion, PLLC

(57) ABSTRACT

The light emitting element includes and active layer that produces light; a polarizer layer having a first region that allows a polarization component in a first direction in the light produced in the active layer to pass through and reflects other polarization components, and a second region that allows a polarization component in a second direction perpendicular to the first direction to pass through and reflects other polarization components; a wave plate layer having a third region and a fifth region that the light exiting from the first region enters, and a fourth region and a sixth region that the light exiting from the second region enters, the wave plate layer causing the lights that have entered the third to sixth regions to exit as lights in the same polarized state; and a reflective layer that reflects the lights reflected by the first region and the second region. The directions of optical axes of the third region and the fifth region, or the fourth region and the sixth region, are perpendicular to each other.

14 Claims, 13 Drawing Sheets

(56) References Cited

FOREIGN PATENT DOCUMENTS

| | | |
|---|---|---|
| JP | 2009128879 A | 6/2009 |
| JP | 2009290895 A | 12/2009 |

OTHER PUBLICATIONS

SID 06 Digest, 2006, pp. 1808-1811, 61.1, Photonic Lattice LEDs for RPTV Light Engines, Christian Hoepfner.

Chinese Office Action for CN Application No. 201180012657.4 issued on Jul. 31, 2014 with English Translation.

(a)

(b)

(a)

(b)

(a)

(b)

POLARIZED LIGHT EMITTING ELEMENT FOR DISPLAY APPARATUS

TECHNICAL FIELD

The present invention relates to a light emitting element that emits linearly polarized light and to an image display apparatus using the light emitting element.

BACKGROUND ART

Image display apparatuses using light emitting diodes (LED) as light emitting elements have been proposed. An image display apparatus of this kind is constructed by including a plurality of LEDs that emit red (R) light, green (G) light and blue (B) light, illumination optical systems that receive lights from the plurality of LEDs, light valves having liquid crystal display panels that receive lights from the illumination optical system, a color combining prism that combines lights of the different colors from the light valves, and a projection optical system for projecting light from the color combining prism onto a projection plane.

With respect to the image display apparatus constructed as described above, there is a demand for preventing the occurrence of optical loss in the optical paths from the light emitting elements to the projection optical system as much as possible in order to increase the luminance of projected images.

The liquid crystal display panels and the color combining prism in the above-described components have polarization dependences. From the viewpoint of improving the efficiency of the optical system, therefore, it is desirable that each light emitting element emit linearly polarized light.

Also, as described in non-patent literature 1, there is a constraint to the efficiency of the optical system due to the etendue determined by the product of the area of the light emitting element and the radiation angle. Specifically, light from the light emitting element is not utilized as projection light, unless the value of the product of the area of the light emitting element and the radiation angle is no more than the product of the area of the entrance surface of the light valve and the acceptance angle determined by the F number of the illumination optical system.

Therefore, the pending problem with image display apparatuses using LEDs is to increase the luminance of each light emitting element is to be increased without increasing the area of the light emitting element in order to reduce the etendue of light emitted from the light emitting element.

With respect to the image display apparatus constructed as described above, there is also a demand for making the uniformity of the light intensity distribution on a screen as high as possible in order to limit luminance unevenness in projected images.

Patent literature 1 (JP2009-111012A) discloses a semiconductor light emitting element designed to emit light having a large polarization ratio and having a nonpolar plane as a principal plane of crystal growth.

Patent literature 2 (JP2007-109689A) discloses a light emitting element designed to reduce the etendue and emit linearly polarized light with high polarization conversion efficiency and having a light emitting portion that is provided on a reference plane and that emits light, a $\lambda/4$ phase plate provided on the exit surface side of the light emitting portion, a reflection-type polarizing plate that is provided on the exit surface side of the $\lambda/4$ phase plate and that allows polarized light in a first oscillation direction to pass therethrough and that reflects polarized light in a second oscillation direction perpendicular to the first oscillation direction, and an optical portion that is provided on the exit surface side of the reflection-type polarizing plate and in which the refractive index is periodically changed in two directions in a plane parallel to the reference plane.

In this light emitting element, light reflected by the reflection-type polarizing plate is reflected by a reflective electrode provided on the side of the light emitting portion opposite from the exit surface of the light emitting portion, and exits and returns through the $\lambda/4$ phase plate so that the oscillation direction is changed through 90 degrees, again enters the reflection-type polarizing plate and passes through the reflection-type polarizing plate.

The applicant of the present application proposed, in Japanese Patent Application No. 2009-243367, an invention devised to realize a light emitting element that has high efficiency and that emits linearly polarized light enabling increasing the luminance.

The light emitting element proposed in Japanese Patent Application No. 2009-243367 has an active layer in which light is produced, a polarizer layer having a first region that allows a polarization component in a first direction in the light produced in the active layer to pass therethrough and reflects other polarization components, and a second region that allows a polarization component in a second direction perpendicular to the first direction to pass therethrough and reflects other polarization components, a wave plate layer having third and fourth regions that receive lights from the first and second regions and cause the received lights to exit as lights in the same polarized state, and a reflective layer that reflects the lights reflected by the first and second regions.

In the above-described light emitting element, the polarization component in the first direction that has entered the first region of the polarizer layer and the polarization component in the second direction that has entered the second region in the light produced in the active layer pass through the polarizer layer, while the polarization component in the second direction that has entered the first region of the polarizer layer and the polarization component in the first direction that has entered the second region are reflected by the polarizer layer. The light reflected by the polarizer layer is reflected by the reflective layer and again enters the polarizer layer. The incident position at this time is different from that at the preceding time. The light that has entered the region different from that the light that entered at the preceding time passes through the polarizer layer. The light that has entered the same region as the light that entered at the preceding time is again reflected by the polarizer layer. By repeating this operation, the whole of the light produced in active layer passes through the polarizer layer in the end. The lights that have passed through the first and second regions of the polarizer layer respectively pass through the third and fourth regions of the wave plate layer to have the same polarization direction.

CITATION LIST

Patent Literature

Patent Literature 1: JP2009-111012A
Patent Literature 2: JP2007-109689A
Patent Literature 3: JP2001-51122A

Non Patent Literature

Non Patent Literature 1: SID 06 DIGEST, 2006, pp. 1808-1811, 61.1, Photonic Lattice LEDs for RPTV Light Engines, Christian Hoepfner

SUMMARY OF INVENTION

Technical Problem

The semiconductor light emitting element described in Patent literature 1 has a nonpolar plane as a principal plane of crystal growth and thereby emits light at a high polarization ratio. However, because of the need to cut out a substrate having a nonpolar plane as a principal plane from a substrate having an ordinary polar plane as a principal plane, there is a problem in which the area of the substrate cannot be increased and the productivity is low.

The light emitting element described in Patent literature 2 uses the reflection-type polarizing plate and the λ/4 phase plate to emit linearly polarized light. However, part of light reflected by the reflection-type polarizing plate and light reflected by the reflective electrode is reflected by the exit surface of the light emitting portion existing between the reflection-type polarizing plate and the reflective electrode. There is, therefore, a problem in which the efficiency of polarization conversion is low if the attenuation of light accompanying multiple reflection is counted, and it is difficult to heighten the luminance.

The light emitting element proposed in Japanese Patent Application No. 2009-243367 emits linearly polarized light by using the polarizer layer, the wave plate layer and the reflective layer. However, the transmittances to the polarization component perpendicular to an optical axis in the wave plate layer and the polarization component parallel to the optical axis and the phase difference between these polarization components are dependent on the incident angle, and the incident angle dependence in a plane perpendicular to the optical axis and the incident angle dependence in a plane parallel to the optical axis are different from each other. Therefore a characteristic of distribution of light exiting from the light emitting element and entering the light valve changes between a plane perpendicular to the optical axis and a plane parallel to the optical axis, so that an asymmetric light distribution characteristic results. Therefore, when used in an image display apparatus, light intensity distribution on a screen is not uniform and appears as luminance unevenness in a projected image.

The present invention has been achieved with a view to addressing the above-described problems of the related art, and an object of the present invention to provide a light emitting element having high efficiency, capable of increasing the luminance and capable of emitting linearly polarized light in which the light distribution characteristic has a good symmetry.

Solution to Problem

A light emitting element in accordance with the present invention is a light emitting element having an active layer that produces light, the light emitting element including:

a polarizer layer having a first region that allows a polarization component in a first direction in the light produced in the active layer to pass therethrough and reflects other polarization components, and a second region that allows a polarization component in a second direction perpendicular to the first direction to pass therethrough and reflects other polarization components;

a wave plate layer having a third region and a fifth region that the light exiting from the first region enters, and a fourth region and a sixth region that the light exiting from the second region enters, the wave plate layer causing the lights that have entered the third to sixth regions to exit as lights in the same polarized state; and a reflective layer that reflects the lights reflected by the first region and the second region, wherein the directions of optical axes of the third region and the fifth region or the fourth region and the sixth region are perpendicular to each other.

An image display apparatus according to the present invention uses the light emitting element having the above-described construction.

Advantageous Effects of Invention

In the light emitting element of the present invention, the polarization component in the first direction that has passed through the first region of the polarizer layer passes through the third region and the fifth region of the wave plate layer, and the polarization component in the second direction that has passed through the second region of the polarizer layer passes through the fourth region and the sixth region of the wave plate layer. The lights that have passed through the third to sixth regions of the wave plate layer have the same polarization direction. The light that has passed through the polarizer layer passes through the wave plate layer without being thereafter reflected. As a result, efficiency is improved and an increase in luminance can be achieved.

The transmission of the polarization components perpendicular to the optical axes in the wave plate layer and the polarization components parallel to the optical axes and the phase difference between these polarization components are dependent on the incident angle, and the incident angle dependences in planes perpendicular to the optical axes and the incident angle dependences in planes parallel to the optical axis are different from each other.

However, since the directions of the optical axes of the third region and the fifth region or the fourth region and the sixth region are perpendicular to each other, a light distribution characteristic as a result of superimposition of lights that have passed through the third to sixth regions and that have entered the light valve does not change between planes perpendicular to the optical axes and planes parallel to the optical axes. That is, the light distribution characteristic that has good symmetry is the result. As a result, in the case of use in an image display apparatus, the light intensity distribution on a screen is uniform and no luminance unevenness occurs in a projected image.

DESCRIPTION OF EMBODIMENTS

Exemplary embodiments of the present invention will be described with reference to the drawings.

Figure 1:
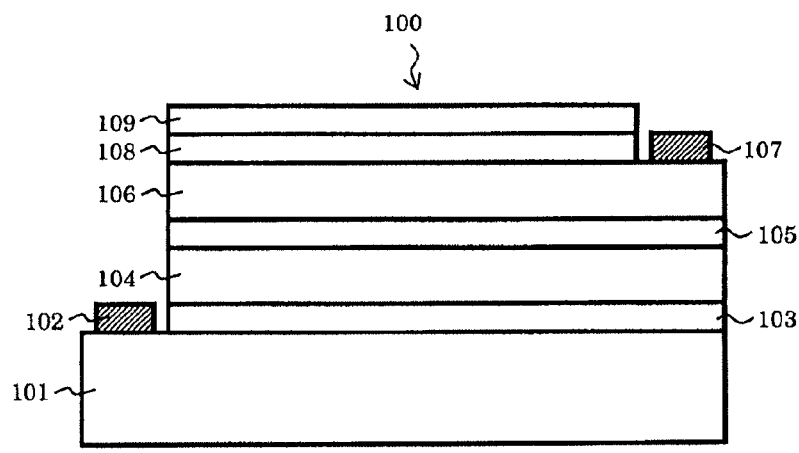
FIG. 1 is a sectional view showing the construction of one exemplary embodiment of a light emitting element in accordance with the present invention.

FIG. 1 is a sectional view showing the construction of one exemplary embodiment of light emitting element 100 according to the present invention. The actual thicknesses of layers in light emitting element 100 are extremely small and the layers vary largely in thickness. It is therefore difficult to depict a figure showing the layers in correct proportions. In the drawings, therefore, the layers are schematically shown and are not drawn to scale.

P-type electrode 102 and reflective layer 103 are formed on sub-mount 101. P-type semiconductor layer 104 is formed on reflective layer 103. Active layer 105 is formed on P-type semiconductor layer 104. N-type semiconductor layer 106 is formed on active layer 105. N-type electrode 107 and polarizer layer 108 are formed on N-type semiconductor layer 106. Half-wave plate layer 109 is formed on polarizer layer 108.

As a material for sub-mount 101, Si, for example, is used. As a material for P-type electrode 102, Ni/Au/Ti/Au, for example, is used. As a material for reflective layer 103, Ag, for example, is used. As a material for P-type semiconductor layer 104, GaN doped with Mg, for example, is used.

For active layer 105, a multiple quantum well structure is used in which a layer formed of GaN and a layer formed of InGaN, for example, are alternately laid one on the other. As a material for N-type semiconductor layer 106, GaN doped with Si, for example, is used. As a material for N-type electrode 107, Ti/Al/Ti/Au, for example, is used.

A method of making light emitting element 100 will be described. First, N-type semiconductor layer 106, active layer 105, P-type semiconductor layer 104 and reflective layer 103 are successively formed on a substrate. Next, reflective layer 103 is adhered onto sub-mount 101, and the substrate is removed.

Next, polarizer layer 108 is formed on N-type semiconductor layer 106. Half-wave plate layer 109 is made by another process and adhered onto polarizer layer 108. Finally, P-type electrode 102 and N-type electrode 107 are formed.

The operation of the present exemplary embodiment will be outlined. A voltage is applied between P-type electrode 102 and N-type electrode 107 to cause a current to flow therebetween, thereby producing light in active layer 105. The light produced in active layer 105 includes various components that travel in various directions.

The light produced in active layer 105 and traveling toward N-type semiconductor layer 106 passes through N-type semiconductor layer 106 and enters polarizer layer 108. The light produced in active layer 105 and traveling toward P-type semiconductor layer 104 passes through P-type semiconductor layer 104, is reflected by reflective layer 103, passes through P-type semiconductor layer 104, active layer 105 and N-type semiconductor layer 106 and enters polarizer layer 108.

Polarizer layer 108 includes a first region and a second region. The first region allows a polarization component in a first direction in the incident light to pass therethrough, and reflects other polarization components. The second region allows a polarization component in a second direction perpendicular to the first direction in the incident light to pass therethrough, and reflects other polarization components. That is, the polarization component in the first direction that has entered the first region and the polarization component in the second direction that has entered the second region in the light that has entered the polarizer layer 108 pass through polarizer layer 108, while the polarization component in the second direction that has entered the first region and the polarization component in the first direction that has entered the second region are reflected by polarizer layer 108.

The light reflected by polarizer layer 108 passes through N-type semiconductor layer 106, active layer 105 and P-type semiconductor layer 104, is reflected by reflective layer 103, passes through P-type semiconductor layer 104, active layer 105 and N-type semiconductor layer 106 and again enters polarizer layer 108. The incident position at this time is different from that at the preceding time. The polarization component in the first direction that has entered the first region and the polarization component in the second direction that has entered the second region in the light that has again entered polarizer layer 108 pass through polarizer layer 108, while the polarization component in the second direction that has entered the first region and the polarization component in the first direction that has entered the second region are again reflected by polarizer layer 108. By repeating this operation, the whole of the light produced in active layer 105 passes through polarizer layer 108 in the end.

Half-wave plate layer 109 includes third to sixth regions. The third and fifth regions of half-wave plate layer 109 are provided in correspondence with the first region of polarizer layer 108, while the fourth and sixth regions of half-wave plate layer 109 are provided in correspondence with the second region of polarizer layer 108. The third and fifth regions allow the incident light to exit while giving predetermined polarization rotation angles. The fourth and sixth regions allow the incident light to exit while giving polarization rotation angles that are the results of the addition of 90 degrees and 270 degrees to the polarization rotation angle given by the third region. As a result, the directions of polarization of the lights that have passed through the third to sixth regions of half-wave plate layer 109 coincide with each other.

Concrete examples of the constructions of polarizer layer 108 and half-wave plate layer 109 will be described below.

Figure 2:
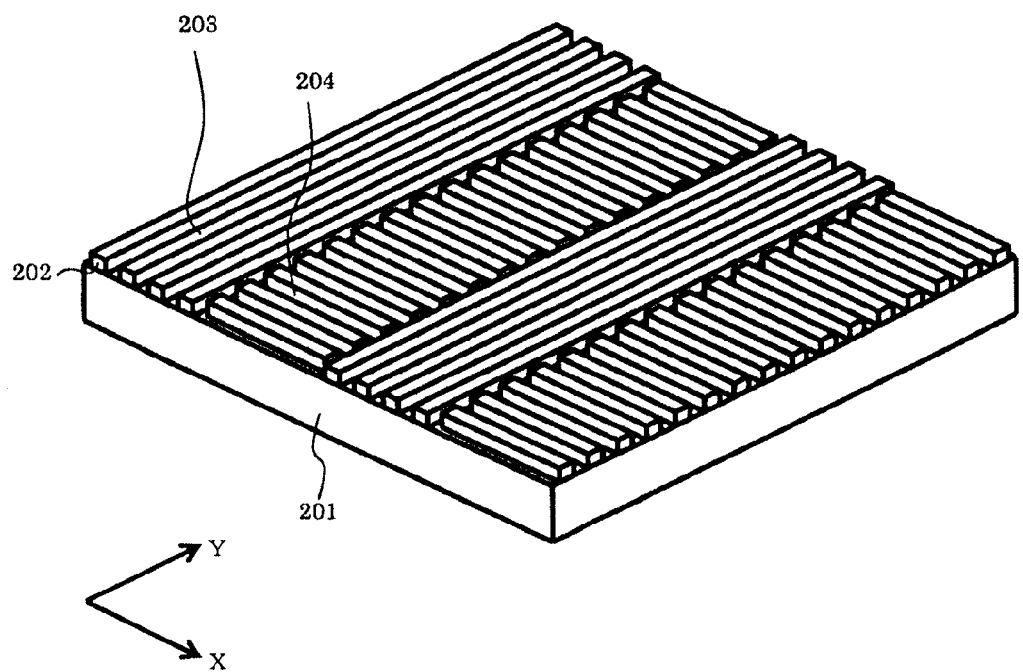
FIG. 2 is a perspective view showing one example of the construction of polarizer layer 108 shown in FIG. 1.

FIG. 2 is a perspective view showing one example of the construction of polarizer layer 108 shown in FIG. 1.

In the example shown in FIG. 2, a polarizer layer formed of a plurality of metal nanowires 202 is formed on N-type semiconductor layer 201. As a material for the metal nanowires 202, Al, for example, is used. The polarizer layer includes first regions 203 and second regions 204 disposed in the form of strips adjacent one to another. The longitudinal directions of metal nanowires 202 in first regions 203 and second regions 204 correspond to the Y-axis direction and the X-axis direction, respectively, in the figure. This polarizer allows the polarization component of incident light perpendicular to the longitudinal direction of metal nanowires 202 to pass therethrough, and reflects the polarization component of the incident light parallel to the longitudinal direction of nanowires 202. Of the light that has entered first region 203, the polarization component along the X-axis direction is allowed to pass. The polarization component of this light along the Y-axis direction is reflected. Of the light that has entered second region 204, the polarization component along the Y-axis direction is allowed to pass. The polarization component of this light along the X-axis direction is reflected.

Figure 3:
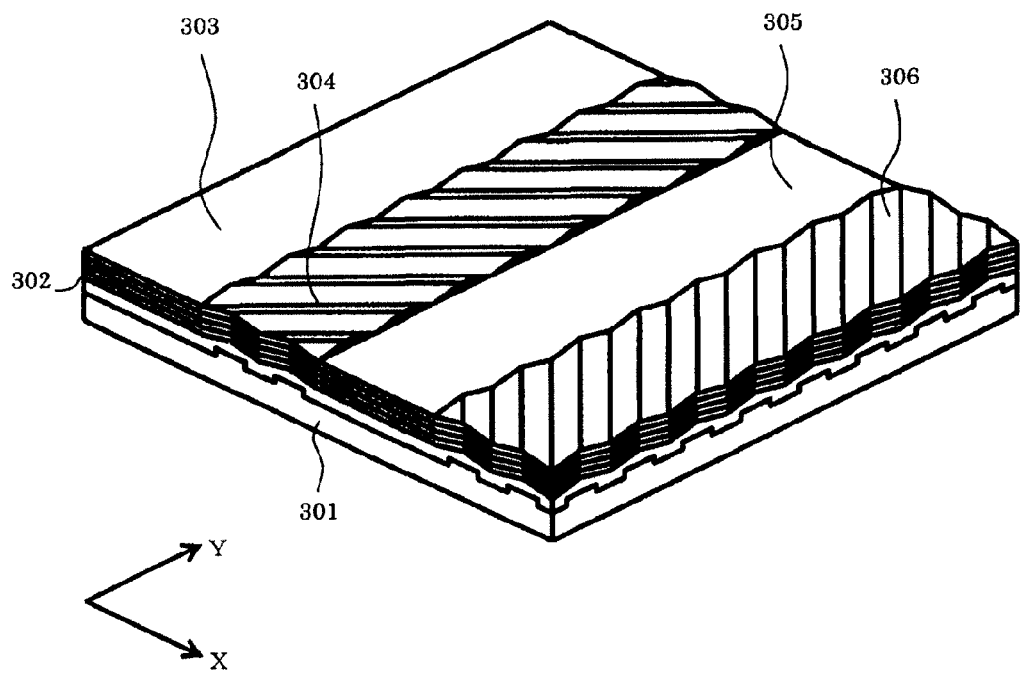
FIG. 3 is a perspective view showing one example of the construction of half-wave plate layer 109 shown in FIG. 1.

FIG. 3 is a perspective view showing one example of the construction of half-wave plate layer 109 shown in FIG. 1.

In the example shown in FIG. 3, a half-wave plate layer formed of dielectric 302 in which a high-refractive-index layer and a low-refractive index layer are alternately laid one on the other is formed on substrate 301. As a material for substrate 301, quartz, for example, is used. As materials for the high-refractive-index layer and the low-refractive index layer in dielectric 302, $Nb_2O_5$ and $SiO_2$, for example, are respectively used. The half-wave plate layer includes first region 303, second region 304, third region 305 and fourth region 306 in the form of strips disposed adjacent one to another. First region 303 and third region 305 of the half-wave plate layer are provided in correspondence with first regions 203 of the polarizer layer shown in FIG. 2, while second region 304 and fourth region 306 of the half-wave plate layer are provided in correspondence with second regions 204 of the polarizer layer shown in FIG. 2.

Each of first region 303 and third region 305 includes no periodic projection/recess structure in the X-Y plane and does not function as a half-wave plate layer. On the other hand, each of second region 304 and fourth region 306 includes a periodic projection/recess structure with respect to a predetermined direction in the X-Y plane, includes no periodic projection/recess structure with respect to a direction perpendicular to the predetermined direction, and functions as a half-wave plate layer, as disclosed in JP2001-51122A. The longitudinal directions (the direction of the optical axes) of the projection/recess structures in second region 304 and fourth region 306 are at angles of 45 degrees and 135 degrees, respectively, from the X-axis in the figure. This half-wave plate layer gives incident light a phase difference of 180 degrees between the polarization component perpendicular to the optical axis and the polarization component parallel to the optical axis.

Then linearly polarized light that has entered first region 303 and third region 305 with a polarization direction corresponding to the X-axis direction is not given any polarization rotation angle in first region 303 and third region 305. This light exits from first region 303 and third region 305 without changing from the linearly polarized light with the polarization direction corresponding to the X-axis direction. Linearly polarized light that has entered second region 304 with a polarization direction corresponding to the Y-axis direction is given a polarization rotation angle of 90 degrees in second region 304, and exits from second region 304 as linearly polarized light with a polarization direction corresponding to the X-axis direction. Linearly polarized light that has entered fourth region 306 with a polarization direction corresponding to the Y-axis direction is given a polarization rotation angle of 270 degrees in fourth region 306, and exits from fourth region 306 as linearly polarized light with a polarization direction corresponding to the X-axis direction. As a result, the directions of polarization of the lights that have passed through first to fourth regions 303 to 306 coincide with each other.

Figure 4:
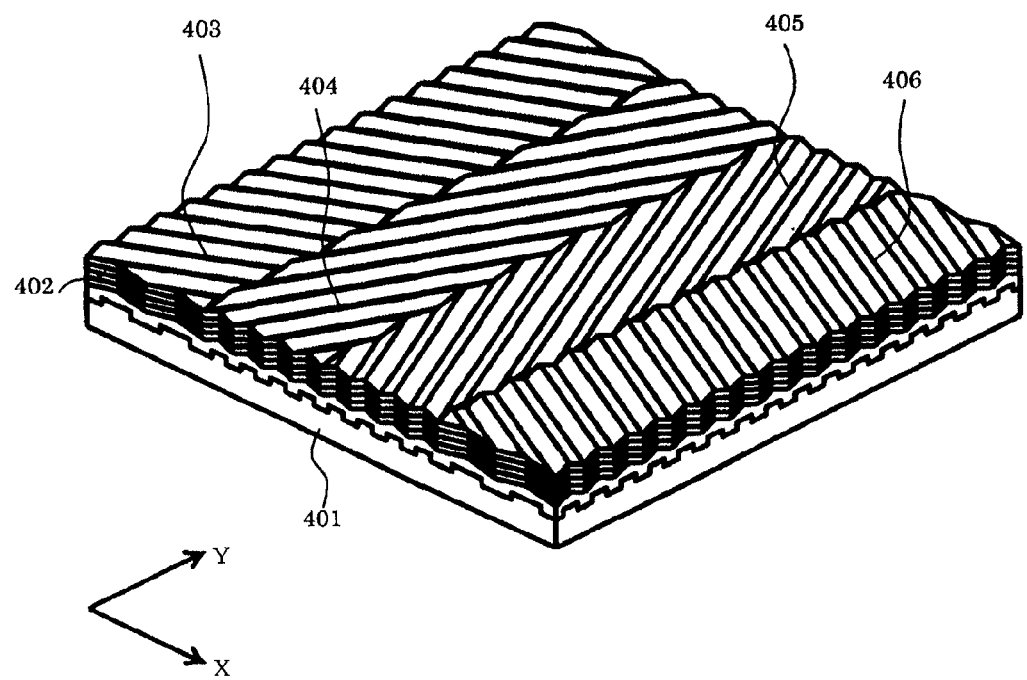
FIG. 4 is a perspective view showing another example of the construction of half-wave plate layer 109 shown in FIG. 1.

FIG. 4 is a perspective view showing another example of the construction of half-wave plate layer 109 shown in FIG. 1.

In the example shown in FIG. 4, a half-wave plate layer formed of dielectric 402 in which a high-refractive-index layer and a low-refractive index layer are alternately laid one on the other is formed on substrate 401. As a material for substrate 401, quartz, for example, is used. As materials for the high-refractive-index layer and the low-refractive index layer in dielectric 402, $Nb_2O_5$ and $SiO_2$, for example, are respectively used. The half-wave plate layer includes first region 403, second region 404, third region 405 and fourth region 406 in the form of strips disposed adjacent one to another. First region 403 and third region 405 of the half-wave plate layer are provided in correspondence with first regions 203 of the polarizer layer shown in FIG. 2, while second region 404 and fourth region 406 of the half-wave plate layer are provided in correspondence with second regions 204 of the polarizer layer shown in FIG. 2.

Each of first to fourth regions 403 to 406 includes a periodic projection/recess structure with respect to a predetermined direction in the X-Y plane, does not include any periodic projection/recess structure with respect to a direction perpendicular to the predetermined direction, and functions as a half-wave plate layer, as disclosed in JP2001-51122A. The longitudinal directions (the direction of the optical axes) of the projection/recess structures in first region 403, second region 404, third region 405 and fourth region 406 are at angles of 22.5 degrees, 67.5 degrees, 112.5 degrees and 157.5 degrees, respectively, from the X-axis in the figure. This half-wave plate layer gives incident light a phase difference of 180 degrees between the polarization component perpendicular to the optical axis and the polarization component parallel to the optical axis.

Then linearly polarized light that has entered first region 403 with a polarization direction corresponding to the X-axis direction is given a polarization rotation angle of 45 degrees in first region 403, and exits from first region 403 as linearly polarized light with a polarization direction at an angle of 45 degrees from the X-axis. Linearly polarized light that has entered third region 405 with a polarization direction corresponding to the X-axis direction is given a polarization rotation angle of 225 degrees in third region 405, and exits from third region 405 as linearly polarized light with a polarization direction at an angle of 225 degrees (45 degrees) from the X-axis. Linearly polarized light that has entered second region 404 with a polarization direction corresponding to the Y-axis direction is given a polarization rotation angle of 135 degrees in second region 404, and exits from second region 404 as linearly polarized light with a polarization direction at an angle of 225 degrees (45 degrees) from the X-axis. Linearly polarized light that has entered fourth region 406 with a polarization direction corresponding to the Y-axis direction is given a polarization rotation angle of 315 degrees in fourth region 406, and exits from fourth region 406 as linearly polarized light with a polarization direction at an angle of 405 degrees (45 degrees) from the X-axis. As a result, the directions of polarization of the lights that have passed through first to fourth regions 403 to 406 coincide with each other.

Figure 5:
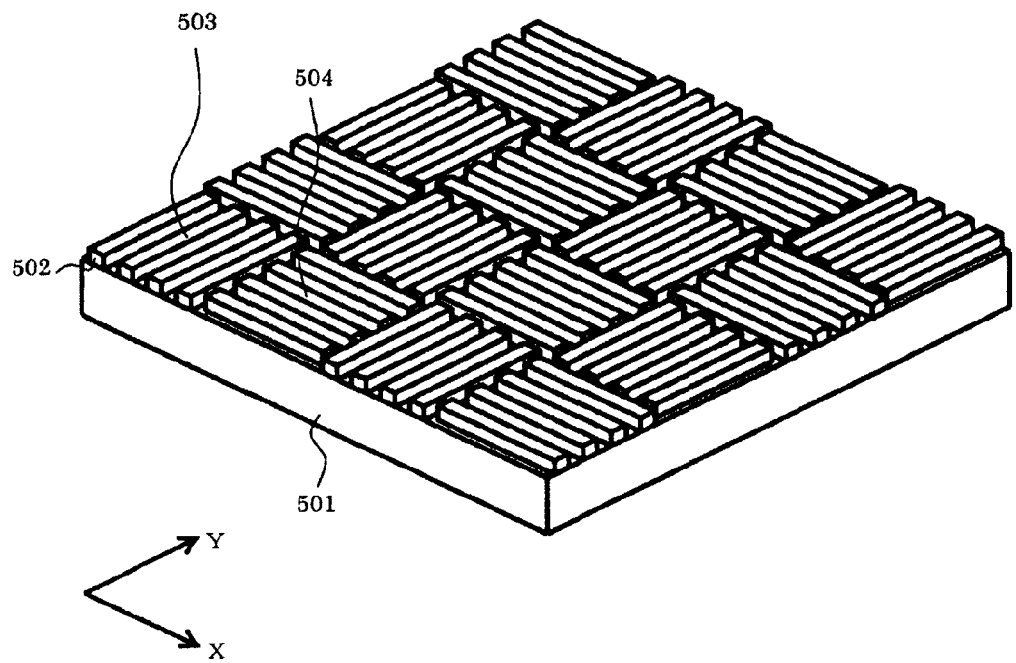
FIG. 5 is a perspective view showing another example of the construction of polarizer layer 108 shown in FIG. 1.

FIG. 5 is a perspective view showing another example of the construction of polarizer layer 108 shown in FIG. 1.

In the example shown in FIG. 5, a polarizer layer formed of a plurality of metal nanowires 502 is formed on N-type semiconductor layer 501. As a material for the metal nanowires 502, Al, for example, is used. The polarizer layer includes first regions 503 and second regions 504 disposed adjacent one to another in a staggered fashion. The longitudinal directions of metal nanowires 502 in first regions 503 and second regions 504 correspond to the Y-axis direction and the X-axis direction, respectively, in the figure. This polarizer allows the polarization component of incident light perpendicular to the longitudinal direction of metal nanowires 502 to pass therethrough, and reflects the polarization component of the incident light parallel to the longitudinal direction of metal nanowires 502. Of the light that has entered first region 503, the polarization component along the X-axis direction is allowed to pass. The polarization component of this light along the Y-axis direction is reflected. Of the light that has entered second region 504, the polarization component along the Y-axis direction is allowed to pass. The polarization component of this light along the X-axis direction is reflected.

Figure 6:
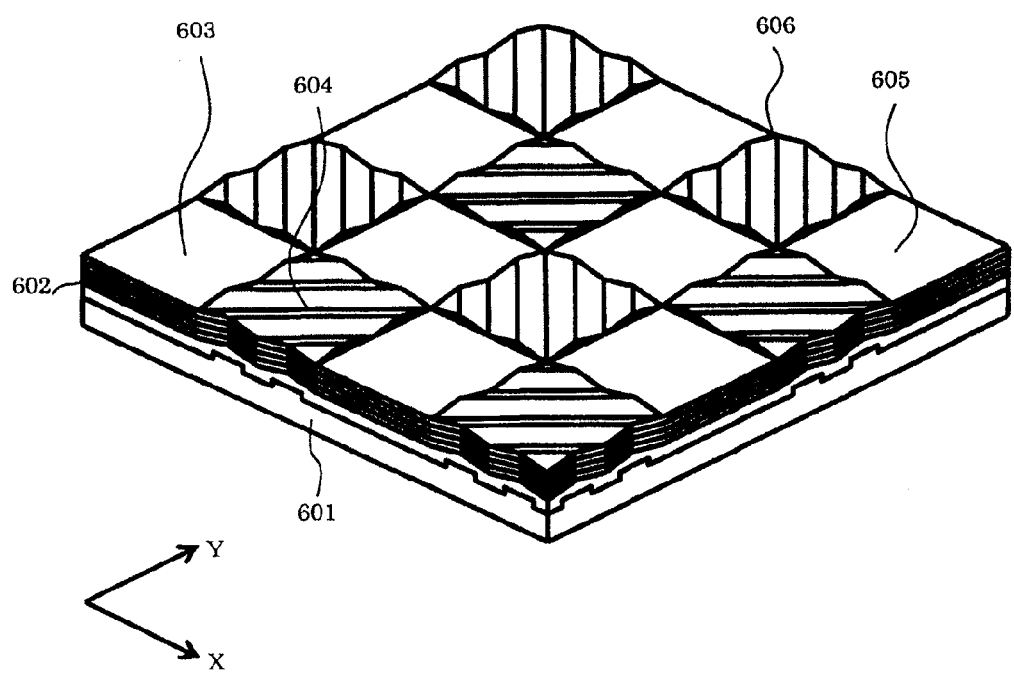
FIG. 6 is a perspective view showing still another example of the construction of half-wave plate layer 109 shown in FIG. 1.

FIG. 6 is a perspective view showing still another example of the construction of half-wave plate layer 109 shown in FIG. 1.

In the example shown in FIG. 6, a half-wave plate layer formed of dielectric 602 in which a high-refractive-index layer and a low-refractive index layer are alternately laid one on the other is formed on substrate 601. As a material for substrate 601, quartz, for example, is used. As materials for the high-refractive-index layer and the low-refractive index layer in dielectric 602, $Nb_2O_5$ and $SiO_2$, for example, are respectively used. The half-wave plate layer includes first regions 603, second regions 604, third regions 605 and fourth regions 606 disposed adjacent one to another in a staggered fashion. First regions 603 and third regions 605 of the half-wave plate layer are provided in correspondence with first regions 503 of the polarizer layer shown in FIG. 5, while second regions 604 and fourth regions 606 of the half-wave plate layer are provided in correspondence with second regions 504 of the polarizer layer shown in FIG. 5.

Each of first regions 603 and third regions 605 do not include a periodic projection/recess structure in the X-Y plane and does not function as a half-wave plate layer. On the other hand, each of second regions 604 and fourth regions 606 includes a periodic projection/recess structure with respect to a predetermined direction in the X-Y plane, do not include a periodic projection/recess structure with respect to a direction perpendicular to the predetermined direction, and functions as a half-wave plate layer, as disclosed in JP2001-51122A. The longitudinal directions (the direction of the optical axes) of the projection/recess structures in second regions 604 and fourth regions 606 are at angles of 45 degrees and 135 degrees, respectively, from the X-axis in the figure. This half-wave plate layer gives incident light a phase difference of 180 degrees between the polarization component perpendicular to the optical axis and the polarization component parallel to the optical axis.

Then linearly polarized light that has entered first regions 603 and third regions 605 with a polarization direction corresponding to the X-axis direction is not given any polarization rotation angle in first regions 603 and third regions 605. This light exits from first regions 603 and third regions 605 without changing from the linearly polarized light with the polarization direction corresponding to the X-axis direction. Linearly polarized light that has entered second regions 604 with a polarization direction corresponding to the Y-axis direction is given a polarization rotation angle of 90 degrees in second regions 604, and exits from second regions 604 as linearly polarized light with a polarization direction corresponding to the X-axis direction. Linearly polarized light that has entered fourth regions 606 with a polarization direction corresponding to the Y-axis direction is given a polarization rotation angle of 270 degrees in fourth regions 606, and exits from fourth regions 606 as linearly polarized light with a polarization direction corresponding to the X-axis direction. As a result, the directions of polarization of the lights that have passed through first to fourth regions 603 to 606 coincide with each other.

Figure 7:
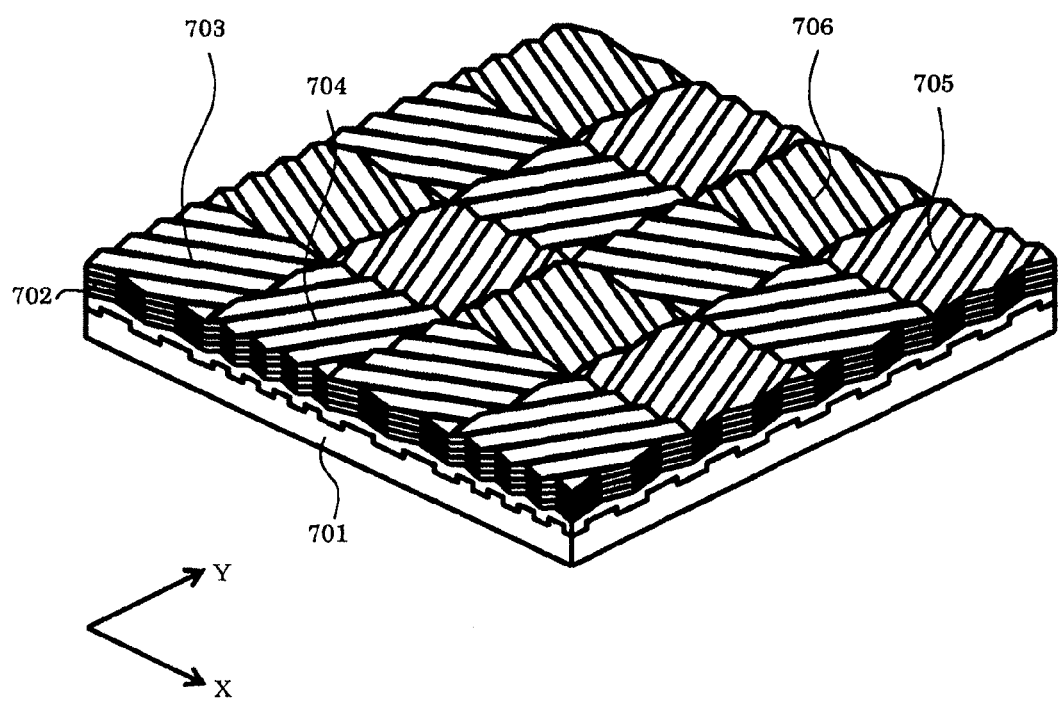
FIG. 7 is a perspective view showing still another example of the construction of half-wave plate layer 109 shown in FIG. 1.

FIG. 7 is a perspective view showing still another example of the construction of half-wave plate layer 109 shown in FIG. 1.

In the example shown in FIG. 7, a half-wave plate layer formed of dielectric 702 in which a high-refractive-index layer and a low-refractive index layer are alternately laid one on the other is formed on substrate 701. As a material for substrate 701, quartz, for example, is used. As materials for the high-refractive-index layer and the low-refractive index layer in dielectric 702, $Nb_2O_5$ and $SiO_2$, for example, are respectively used. The half-wave plate layer includes first region 703, second region 704, third region 705 and fourth region 706 disposed adjacent one to another in a staggered fashion. First region 703 and third region 705 of the half-wave plate layer are provided in correspondence with first regions 503 of the polarizer layer shown in FIG. 5, while second region 704 and fourth region 706 of the half-wave plate layer are provided in correspondence with second regions 504 of the polarizer layer shown in FIG. 5.

Each of first to fourth regions 703 to 706 includes a periodic projection/recess structure with respect to a predetermined direction in the X-Y plane, do not include a periodic projection/recess structure with respect to a direction perpendicular to the predetermined direction, and functions as a half-wave plate layer, as disclosed in JP2001-51122A. The longitudinal directions (the direction of the optical axes) of the projection/recess structures in first regions 703, second regions 704, third regions 705 and fourth regions 706 are at angles of 22.5 degrees, 67.5 degrees, 112.5 degrees and 157.5 degrees, respectively, from the X-axis in the figure. This half-wave plate layer gives incident light a phase difference of 180 degrees between the polarization component perpendicular to the optical axis and the polarization component parallel to the optical axis.

Then linearly polarized light that has entered first regions 703 with a polarization direction corresponding to the X-axis direction is given a polarization rotation angle of 45 degrees in first regions 703, and exits from first regions 703 as linearly polarized light with a polarization direction at an angle of 45 degrees from the X-axis. Linearly polarized light that has entered third regions 705 with a polarization direction corresponding to the X-axis direction is given a polarization rotation angle of 225 degrees in third regions 705, and exits from third regions 705 as linearly polarized light with a polarization direction at an angle of 225 degrees (45 degrees) from the X-axis. Linearly polarized light that has entered second regions 704 with a polarization direction corresponding to the Y-axis direction is given a polarization rotation angle of 135 degrees in second regions 704, and exits from second regions 704 as linearly polarized light with a polarization direction at an angle of 225 degrees (45 degrees) from the X-axis. Linearly polarized light that has entered fourth regions 706 with a polarization direction corresponding to the Y-axis direction is given a polarization rotation angle of 315 degrees in fourth regions 706, and exits from fourth regions 706 as linearly polarized light with a polarization direction at an angle of 405 degrees (45 degrees) from the X-axis. As a result, the directions of polarization of the lights that have passed through first to fourth regions 703 to 706 coincide with each other.

In the case where the first regions and the second regions of polarizer layer 108 and the first to fourth regions of ½ polarizer plate layer 109 are disposed in the form of strips adjacent one to another as shown in FIGS. 2 to 4, alignment between polarizer layer 108 and half-wave plate layer in the X-Y plane can be easily performed.

In the case where the first regions and the second regions of polarizer layer 108 and the first to fourth regions of ½ polarizer plate layer 109 are disposed adjacent one to another in a staggered fashion as shown in FIGS. 5 to 7, the influence of nonuniformity of light intensity distribution on the emission surface of light emitting element 100 upon nonuniformity of light intensity distribution on a screen can be reduced.

The transmittance of the polarization component perpendicular to the optical axis in the half-wave plate layer and the polarization component parallel to the optical axis and the phase difference between these components will be described. The constructions of second region 304 and fourth region 306 shown in FIG. 3 are considered as the construction of the half-wave plate. The wave of incident light is assumed to be 450 nm. The materials of the high-refractive-index layer and the low-refractive-index layer are assumed to be Nb2O5 and SiO2, respectively. The thickness of each of these layers is assumed to be 84 nm; the numbers of layers as each kind of layer, 16; and the periodicity of the projection/recess structure in the X-Y plane, 160 nm. Under this condition, incident-angle dependencies of the transmittance and the phase difference were calculated.

Figure 8:
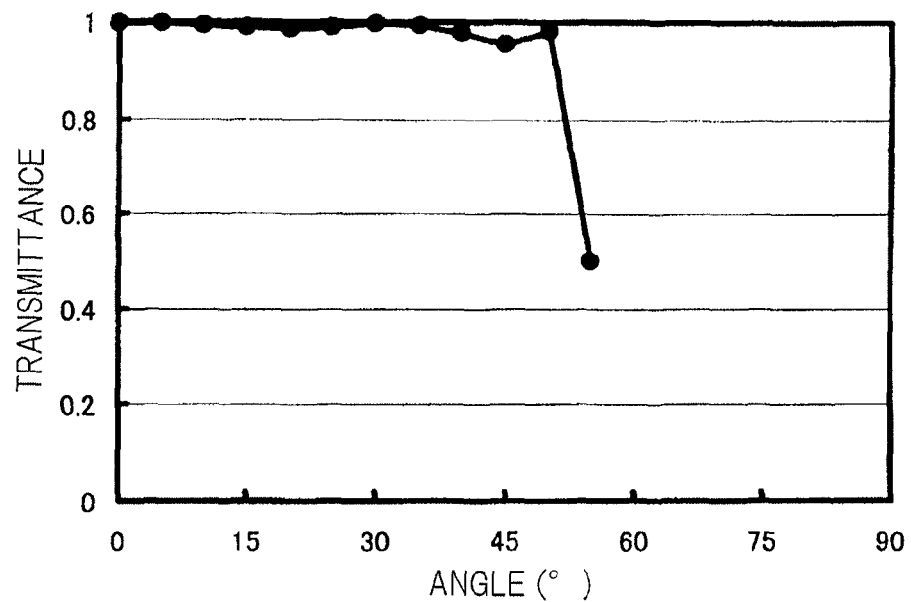
FIG. 8 shows diagrams showing an example of computation of the relationship between the angle of incident light and the transmittance in the half-wave plate layer.
Figure 8:
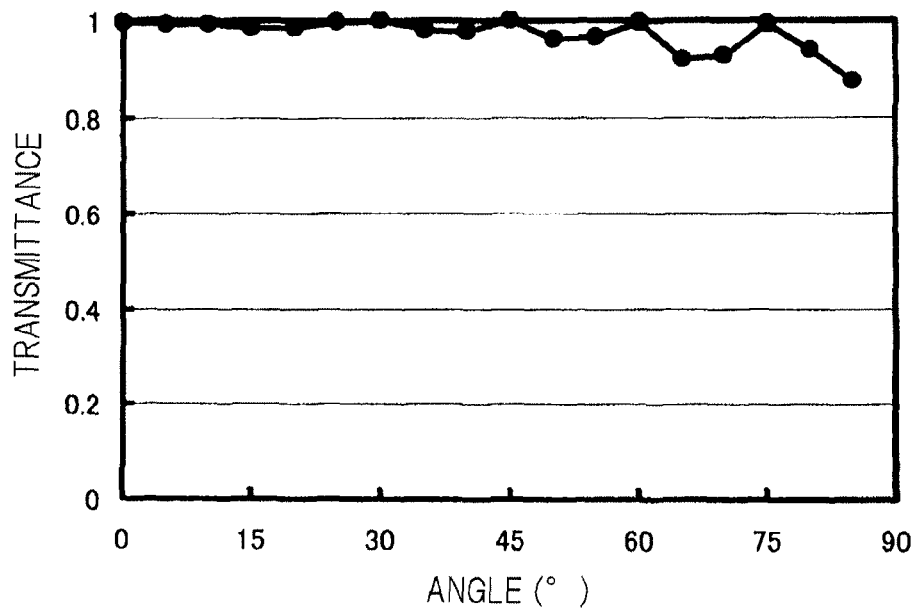

FIG. 8 shows diagrams showing an example of computation of the relationship between the angle of incident light and the transmittance in the half-wave plate layer. FIG. 8 shows in (a) an example of computation when the angle of incident light is changed in a plane perpendicular to the optical axis. FIG. 8 shows in (b) an example of computation when the angle of incident light is changed in a plane parallel to the optical axis. The horizontal axis in the diagram represents the angle of incident light and the vertical axis represents the transmittance as the average of the polarization component perpendicular to the optical axis and the polarization component parallel to the optical axis.

The transmittance is substantially 1 when the angle of incident light is 0 degree. In a plane perpendicular to the optical axis, the transmittance drops abruptly when the angle of incident light exceeds 50 degrees. In contrast, in a plane parallel to the optical axis, the transmittance does not drop largely even when the angle of incident light becomes close to 90 degrees.

Figure 9:
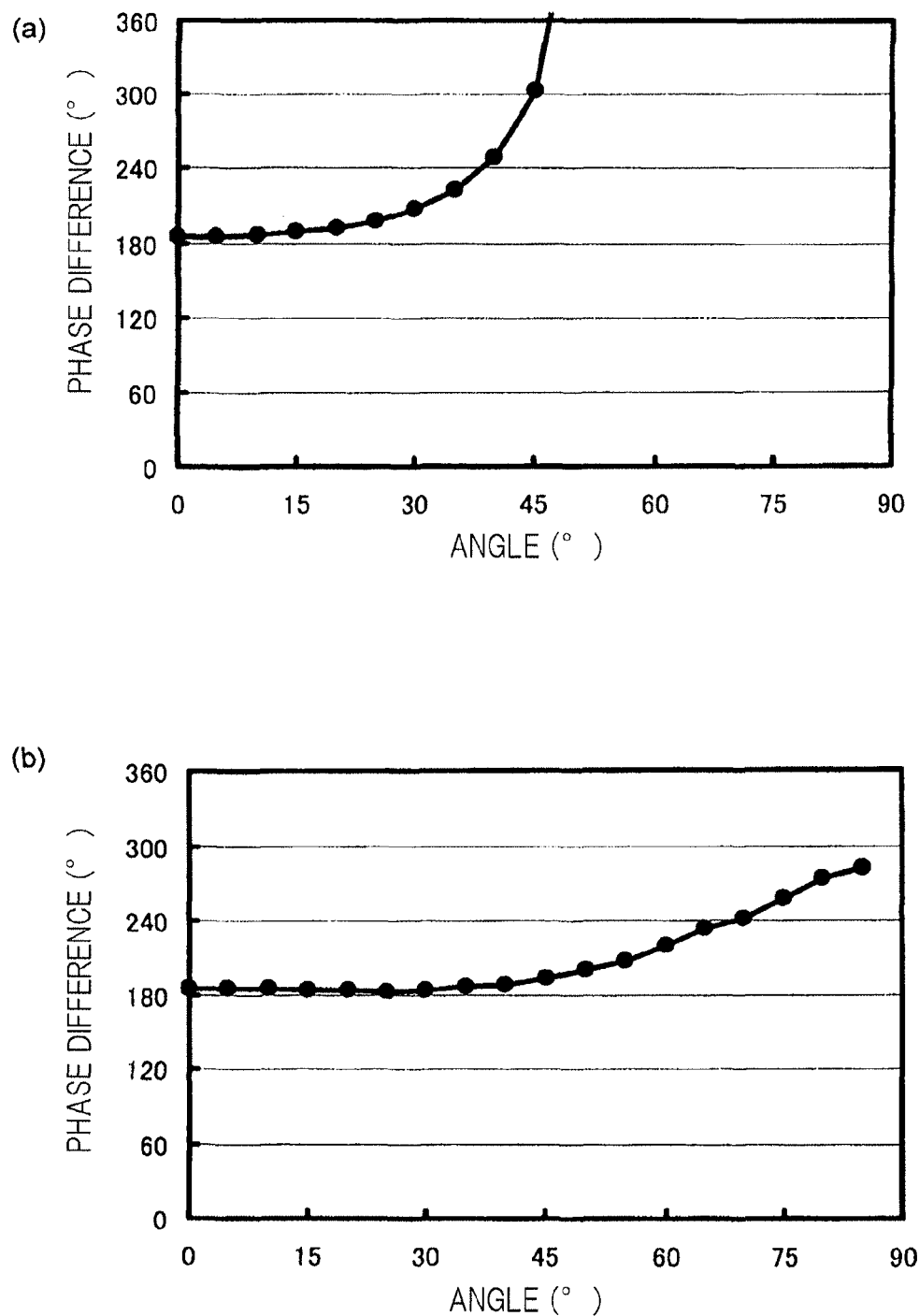
FIG. 9 shows diagrams showing an example of computation of the relationship between the angle of incident light and the phase difference in the half-wave plate layer.

FIG. 9 shows diagrams showing an example of computation of the relationship between the angle of incident light and the phase difference in the half-wave plate layer. FIG. 9 shows in (a) an example of computation when the angle of incident light is changed in a plane perpendicular to the optical axis. FIG. 9 shows in (b) an example of computation when the angle of incident light is changed in a plane parallel to the optical axis. The horizontal axis in the diagram represents the angle of incident light and the vertical axis represents the phase difference between the polarization component perpendicular to the optical axis and the polarization component parallel to the optical axis.

When the angle of incident light is 0 degree, the phase difference is substantially 180 degrees. In a plane perpendicular to the optical axis, the phase difference changes abruptly when the angle of incident light exceeds 30 degrees, and the phase difference reaches 360 degrees when the angle of incident light is about 45 degrees. In contrast, in a plane parallel to the optical axis, the phase difference settles about 270 degrees without changing largely even when the angle of incident light approaches 90 degrees.

If the transmittance is T and the phase difference is δ, the efficiency with respect to light exiting from the light emitting element, passing through the half-wave plate layer and entering a light valve (hereinafter referred to as "the efficiency of the half-wave plate layer") is expressed by $T \sin^2(\delta/2)$. The efficiency when the angle of incident light is 0 degree is substantially 1. In a plane perpendicular to the optical axis, the efficiency is reduced with an increase in the angle of incident light and becomes substantially zero when the angle of incident light is about 45 degrees. In contrast, in a plane parallel to the optical axis, the efficiency settles about 0.5 without being largely reduced even when the angle of incident light approaches 90 degrees.

An angle dependency of the intensity of light exiting from a LED is ordinarily expressed by $\cos \theta$ if the angle of light exiting from the LED is θ. Then an angle dependency of the intensity of light exiting from the light emitting element using the half-wave plate layer is as described below, if the efficiency of the half-wave plate layer is considered. In a plane perpendicular to the optical axis, the intensity of light can be approximated not by $\cos \theta$ but by $\cos 2\theta$, since the intensity of light is substantially 0 when θ is about 45 degrees. In contrast, in a plane parallel to the optical axis, the intensity of light can be approximated by $\cos \theta$ since it is much lower than $\cos \theta$ even when θ approaches 90 degrees.

Figure 19:
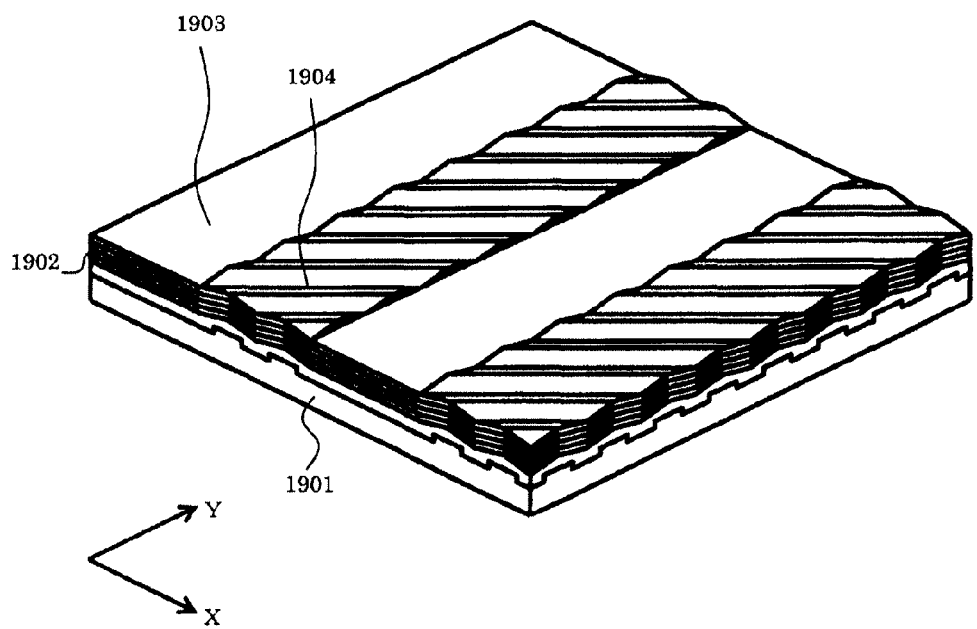
FIG. 19 is a perspective view showing an example of the construction of a half-wave plate layer in a conventional light emitting element.

Comparison will be made below with respect to a light distribution characteristic that is symmetrical and a light intensity distribution on a screen between a case where the light emitting element proposed in Japanese Patent Application No. 2009-243367 is used and a case where the light emitting element of the present invention is used. As a half-wave plate layer used in the light emitting element proposed in Japanese Patent Application No. 2009-243367, one shown in FIG. 19 is considered. In the example shown in FIG. 19, a half-wave plate layer formed of dielectric 1902 is formed on substrate 1901. The half-wave plate layer has first region 1903 and second region 1904 disposed in the form of strips adjacent to each other. First region 1903 does not function as a half-wave plate. Second region 1904 functions as a half-wave plate. The direction of optical axis in second region 1904 is at 45 degrees from the X-axis in the figure. Attention is focused here on light passing through second region 1904. On the other hand, as the half-wave plate layer used in the light emitting element of the present invention, the one shown in FIG. 3 is considered. Attention is focused on light passing through second region 304 and fourth region 306.

Figure 10:
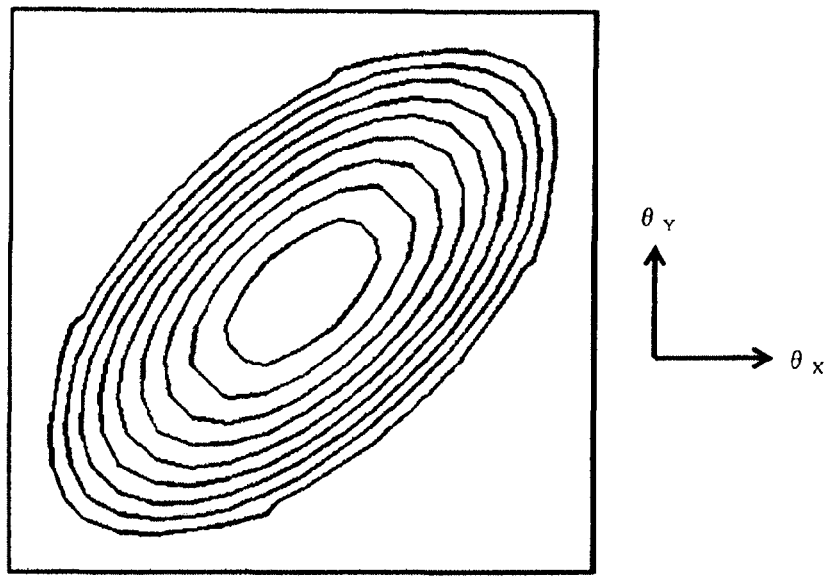
FIG. 10 shows diagrams showing an example of computation of a characteristic of the distribution of light exiting from a light emitting element and entering a light valve.
Figure 10:
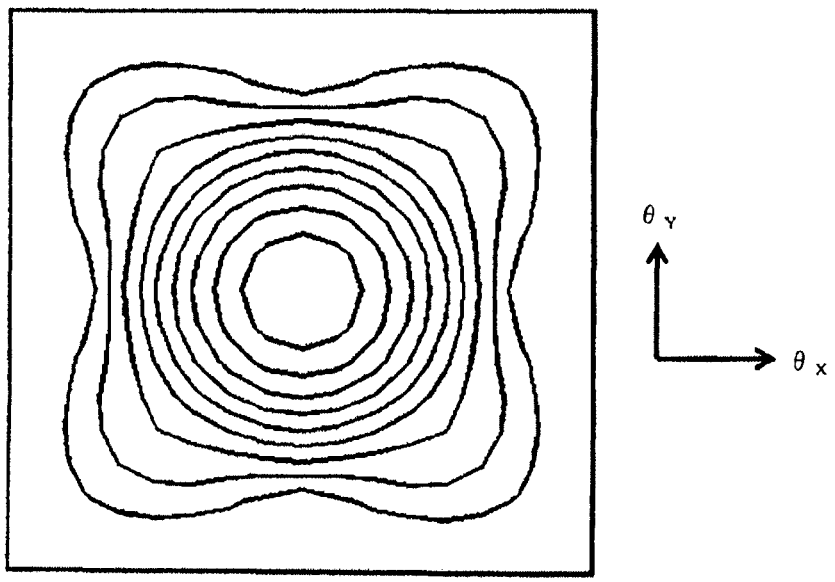

FIG. 10 shows diagrams showing an example of computing of a characteristic of distribution of light exiting from a light emitting element and entering a light valve. FIG. 10 shows in (a) an example of computation in a case where the half-wave plate layer shown in FIG. 19 is used. FIG. 10 shows in (b) an example of computation in a case where the half-wave plate layer shown in FIG. 3 is used. The horizontal direction and the vertical direction in the diagram, respectively correspond to the angles of light in sections along the X-axis direction and the Y-axis direction, and the indication ranges are $-90° \leq \theta_X \leq +90°$ and $-90° \leq \theta_Y \leq +90°$. In the diagram, the intensities of light corresponding to the angles of light are indicated by equi-intensity contours.

In the case where the half-wave plate layer shown in FIG. 19 is used, as shown in FIG. 10(a), the intensity of light in a section in a direction at an angle of 135 degrees from the $\theta_X$-axis in the figure (in a plane perpendicular to the optical axis) is given by cos 2θ, while the intensity of light in a section in a direction at an angle of 45 degrees from the $\theta_X$-axis in the figure (in a plane parallel to the optical axis) is given by cos θ. Therefore, the intensity of light is higher in the region in which $\theta_X<0$ and $\theta_Y<0$ and in the region in which $\theta_X>0$ and $\theta_Y>0$, while the intensity of light is lower in the region in which $\theta_X<0$ and $\theta_Y>0$ and in the region in which $\theta_X>0$ and $\theta_Y<0$, and the resulting light distribution characteristic exhibits an undesirable symmetry.

On the other hand, in the case where the half-wave plate layer shown in FIG. 3 is used, a characteristic of distribution of light passing through second region 304 and entering the light valve is the same as that shown in FIG. 10(a), and a characteristic of distribution of light passing through fourth region 306 and entering the light valve corresponds to the result of rotating the characteristic shown in FIG. 10(a) by 90 degrees in the $\theta_X$-$\theta_Y$ plane. Therefore, by superimposing the two lights one on the other, the intensities of light in a section in a direction at an angle of 135 degrees from the $\theta_X$-axis in the figure and the intensities of light in a section in a direction at an angle of 45 degrees from the $\theta_X$-axis in the figure are averaged, as shown in FIG. 10(b). As a result, the intensities of light are equal to each other in the region where $\theta_X<0$ and $\theta_Y<0$, the region where $\theta_X>0$ and $\theta_Y>0$, the region where $\theta_X<0$ and $\theta_Y>0$ and the region where $\theta_X>0$ and $\theta_Y<0$, and the resulting light distribution characteristic has a good symmetry.

Figure 11:
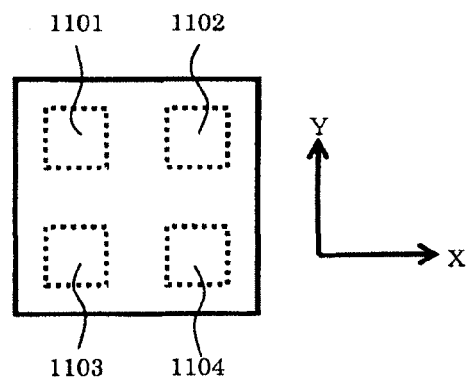
FIG. 11 shows diagrams showing the construction of a light source unit using light emitting elements.
Figure 11:
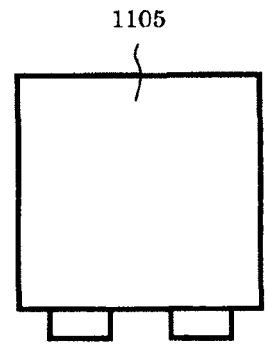

FIG. 11 shows diagrams showing the construction of a light source unit using light emitting elements. FIG. 11 consists of a plan view in (a) and a side view in (b). In an image display apparatus, a plurality of light emitting elements are ordinarily used in order to heighten the luminance of a projected image. Also, a rod integrator is used to combine lights exiting from the plurality of light emitting elements and improve the uniformity of light intensity distribution on a screen. In this case, the light source unit is constructed by using four light emitting elements 1101 to 1104 and rod integrator 1105.

If rod integrator 1105 has a size W×W in the X-Y plane, a length L and a refractive index n, it is assumed that W=L tan φ (φ=sin$^{-1}$(1/n)). Also, if a center of rod integrator 1105 corresponds to the origin, the centers of four light emitting elements 1101 to 1104 in the X-Y plane are assumed to be at positions of X=±W/4, Y=±W/4. Rod integrator 1105 superimposes light on the exit surface lights exiting from arbitrary points on the entrance surface so that the uniformity of a distribution of intensity of light on the exit surface is improved. As representatives of the points on the entrance surface, the centers of four light emitting elements 1101 to 1104 were selected and a distribution of intensity of light on the exit surface when lights exiting from the centers of four light emitting elements 1101 to 1104 were superimposed on each other on the exit surface was computed.

Figure 12:
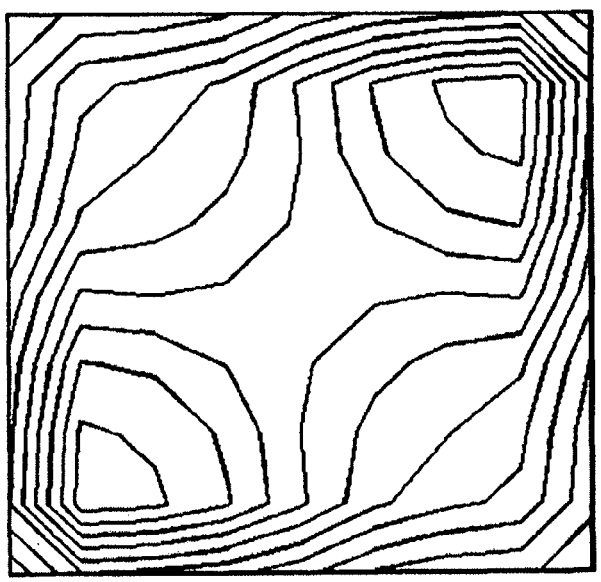
FIG. 12 shows diagrams showing an example of computation of the light intensity distribution on the exit surface of the light source unit.
Figure 12:
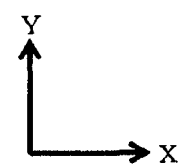
Figure 12:
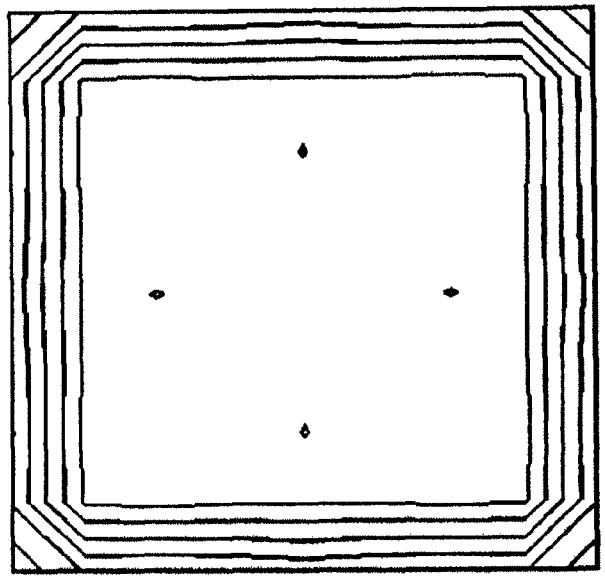
Figure 12:
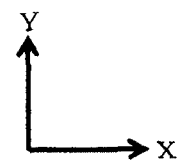

FIG. 12 shows diagrams showing an example of computing of the light intensity distribution on the exit surface of the light source unit. FIG. 12 shows in (a) an example of computation in a case where the half-wave plate layer shown in FIG. 19 is used. FIG. 12 shows in (b) an example of computation in a case where the half-wave plate layer shown in FIG. 3 is used. The horizontal direction and the vertical direction in the diagram, respectively correspond to the positions in the X-axis and Y-axis directions, and the indication ranges are $-W/2 \leq X \leq +W/2$ and $-W/2 \leq Y \leq +W/2$. In the diagram, the intensities of light corresponding to the positions are indicated by equi-intensity contours.

In the case where the half-wave plate layer shown in FIG. 19 is used, as shown in FIG. 12(a), the intensity of light in a section in a direction at an angle of 135 degrees from the X-axis in the figure (in a plane perpendicular to the optical axis) is weaker, while the intensity of light in a section in a direction at an angle of 45 degrees from the X-axis in the figure (in a plane parallel to the optical axis) is stronger. As a result, the intensity of light is higher in the region in which X<0 and Y<0 and in the region in which X>0 and Y>0, while the intensity of light is lower in the region in which X<0 and Y>0 and in the region in which X>0 and Y<0, and the resulting light intensity distribution has a low degree of uniformity.

On the other hand, in the case where the half-wave plate layer shown in FIG. 3 is used, the light intensity distribution on the exit surface of the light source unit of light passing through second region 304 is the same as that shown in FIG. 12(a), and the light intensity distribution on the exit surface of light from the light source unit, that passes through fourth region 306 corresponds to the result of rotating the characteristic shown in FIG. 12(a) by 90 degrees in the X-Y plane. Therefore, by superimposing the two lights one on the other, the intensities of light in a section in a direction at an angle of 135 degrees from the X-axis in the figure and the intensities of light in a section in a direction at an angle of 45 degrees from the X-axis in the figure are averaged, as shown in FIG. 12(b). As a result, the intensities of light in the region in which X<0 and Y<0, the region in which X>0 and Y>0, the region in which X<0 and Y>0 and the region in which X>0 and Y<0, are equal to each to each other, and the resulting light intensity distribution has a desirable degree of uniformity.

It is assumed that in the image display apparatus an area of $-3W/8 \leq X \leq +3W/8$ and $-3W/8 \leq Y \leq +3W/8$ in the exit surface of the light source unit is imaged on the light valve through a collective lens and is further imaged on the screen through a projection lens. A value that is calculated by dividing a standard deviation σ of the intensity of light on the screen by the average μ of the intensity of light is 0.242 in the case where the half-wave plate layer shown in FIG. 19 is used, and is 0.014 in the case where the half-wave plate layer shown in FIG. 3 is used. If the value of σ/μ is reduced, the uniformity of the light intensity distribution on the screen is improved and the luminance unevenness of the projected image is limited.

With respect to the case where the half-wave plate layer shown in FIG. 19 is used, attention is focused on light that passes through second region 1904. In actuality, however, attention needs to be paid to light that also includes light that passes through first region 1903. The light intensity distribution on the exit surface of the light source unit of light that has passed through first region 1903 is generally uniform. Therefore, if light including this light is taken into consideration, the value of σ/μ is about half of 0.242.

With respect to the case where the half-wave plate layer shown in FIG. 3 is used, light that passes through second region 304 and fourth region 306 is taken into consideration. In actuality, however, light including light that passes through first region 303 and third region 305 does not need to be taken into consideration. The light intensity distribution on the exit surface of the light source unit of light that has passed through first region 303 and third region 305 is generally uniform. Therefore, if light including this light is taken into consideration, the value of σ/μ is about half of 0.014.

As described above, in the case where the light emitting element proposed in Japanese Patent Application No. 2009-243367 and using the half-wave plate layer shown in FIG. 19 is used in an image display apparatus, there is a possibility of the light intensity distribution on a screen being non-uniform, depending on symmetry of the light distribution characteristic and, hence, uneven luminance occurs in a projected image. In contrast, in the case of using in an image display apparatus including the light emitting element of the present invention using the half-wave plate layer shown in FIG. 3, the light intensity distribution on a screen is uniform and there is hardly any occurrence of uneven luminance in a projected image, because the light emitting element has a good symmetry of the light distribution characteristic.

The description has been made with respect to the case where the half-wave plate layer shown in FIG. 3 is used in the light emitting element of the present invention. It can be easily understood that the same effect can be obtained in the case of using the half-wave plate layer shown in FIG. 4, 6, or 7 because the half-wave plate layer has two regions having optical axes perpendicular to each other.

Figure 13:
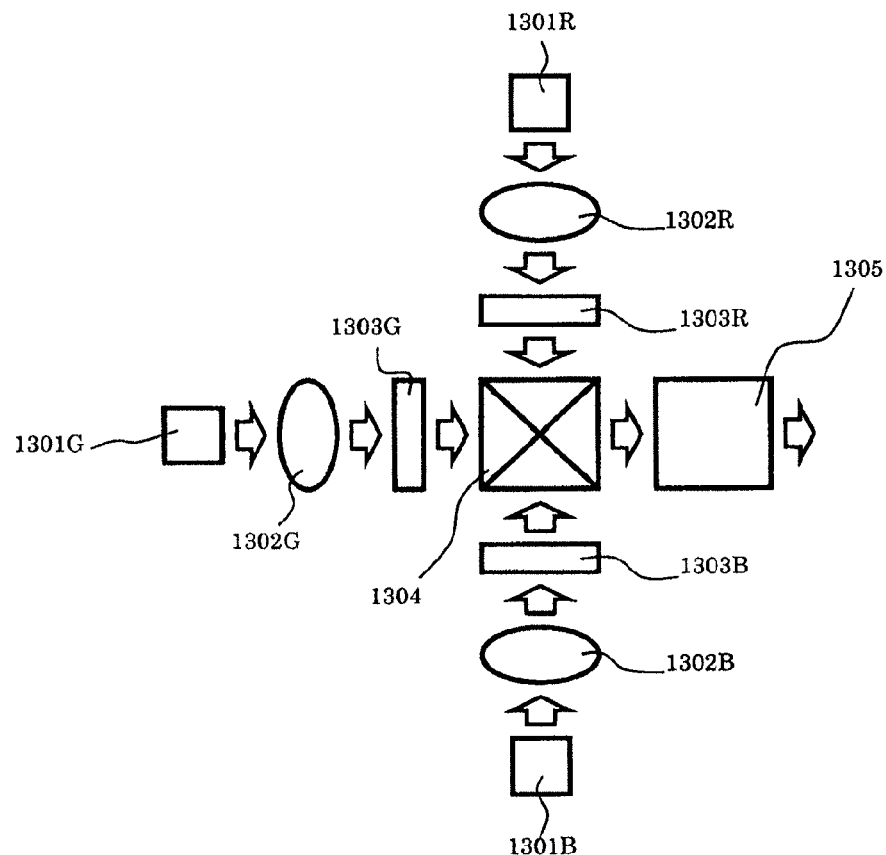
FIG. 13 is a block diagram showing the construction of one exemplary embodiment of an image display apparatus using the light emitting element in accordance with the present invention.

FIG. 13 is a block diagram showing the construction of one exemplary embodiment of an image display apparatus using the light emitting element in accordance with the present invention. The image display apparatus in the present exemplary embodiment forms an image by using liquid crystal display devices 1303R, 1303G, and 1303B each formed of a plurality of pixels. Each pixel has liquid crystal molecules whose orientation is individually controllable.

The image display apparatus shown in FIG. 13 has light source unit 1301R that generates red light, light source unit 1301G that generates green light and light source unit 1301B that generates blue light. Each of these light source units includes four light emitting elements in accordance with the present invention and a rod integrator, as described above with reference to FIG. 11.

Red light produced in light source unit 1301R is applied through condenser lens 1302R to liquid crystal display device 1303R that displays a red image. Red image light thereby produced in liquid crystal display device 1303R enters color combining prism 1304.

Green light produced in light source unit 1301G is applied through condenser lens 1302G to liquid crystal display device 1303G that displays a green image. Green image light thereby produced in liquid crystal display device 1303G enters color combining prism 1304.

Blue light produced in light source unit 1301B is applied through condenser lens 1302B to liquid crystal display device 1303B that displays a blue image. Blue image light thereby produced in liquid crystal display device 1303B enters color combining prism 1304.

The red image light, the green image light and the blue image light entering color combining prism 1304 are combined in color combining prism 1304, and the combined image light is projected onto a screen through projection lens 1305.

The image display apparatus in the present exemplary embodiment is capable of doubling the luminance in comparison with an image display apparatus having a similar construction and using light source units not having the polarizations of exiting light made uniform, since an optical loss of 50% is not caused in liquid crystal display devices 1303R, 1303G, and 1303B.

Figure 14:
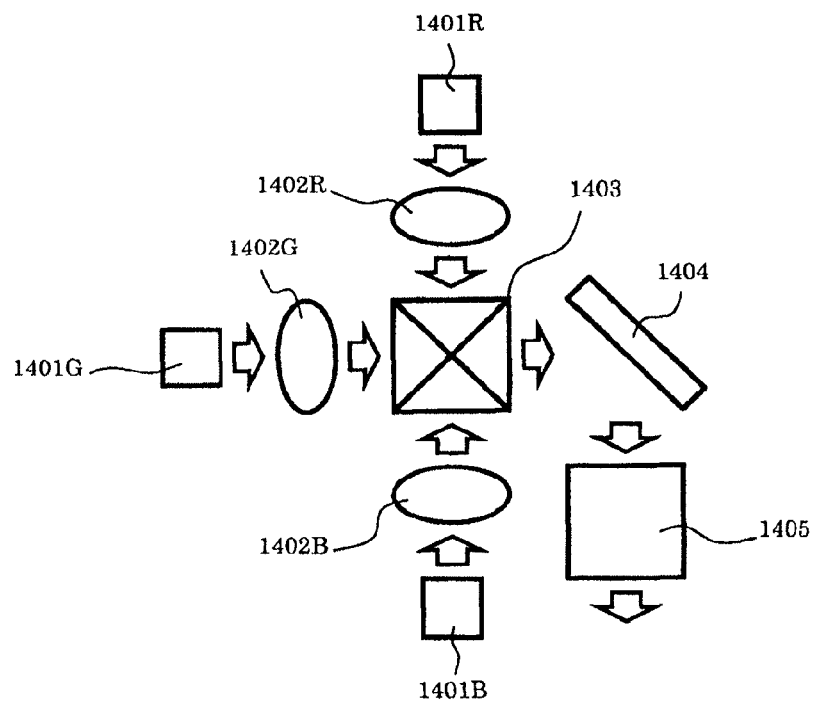
FIG. 14 is a block diagram showing the construction of another exemplary embodiment of the image display apparatus using the light emitting element in accordance with the present invention.

FIG. 14 is a block diagram showing the construction of another exemplary embodiment of the image display apparatus using the light emitting element in accordance with the present invention. The image display apparatus in the present exemplary embodiment forms an image by using micromirror device 1404 formed of a plurality of pixels each having a micromirror whose angle is individually controllable.

The image display apparatus shown in FIG. 14 has light source unit 1401R that generates red light, light source unit 1401G that generates green light and light source unit 1401B that generates blue light. Each of these light source units includes four light emitting elements in accordance with the present invention and a rod integrator, as described above with reference to FIG. 11.

Red light produced in light source unit 1401R enters color combining prism 1403 through condenser lens 1402R. Green light produced in light source unit 1401G enters color combining prism 1403 through condenser lens 1402G. Blue light produced in light source unit 1401B enters color combining prism 1403 through condenser lens 1402B.

Light source unit 1401R, light source unit 1401G and light source unit 1401B can be controlled so that the respective color lighting states are successively changed. Red light, green light and blue light are successively applied from color combining prism 1403 to micromirror device 1404.

Micromirror device 1404 displays images according to the applied colors one after another. Red image light, green image light and blue image light produced in micromirror device 1404 are thereby projected onto the screen one after another through projection lens 1405.

Color combining prism 1403 reflects the entire s-polarized component of red light, allows the entire p-polarized component of green light to pass therethrough, and reflects the entire s-polarized component of blue light. Color combining prism 1403, however, reflects only a part of the p-polarized component of red light, allows only a part of the s-polarized component of green light to pass therethrough, and reflects only a part of the p-polarized component of blue light.

Therefore, if the polarizations of the lights exiting from the light source units are not uniform, optical loss occurs in one of the polarized components of each of the red light, the green light and the blue light in color combining prism 1403, while no optical loss occurs in the other polarized component.

In contrast, in the case where lights exiting from the light source units are linearly polarized lights, no optical loss occurs in each of the red light, the green light and the blue light in color combining prism 1403 if the red light is caused to enter color combining prism 1403 as s-polarized light; the green light as p-polarized light; and the blue light as s-polarized light.

That is, the image display apparatus in the present exemplary embodiment is capable of increasing the luminance in comparison with an image display apparatus that has a similar construction and that uses light source units that do not have the polarizations of exiting light made uniform, since no optical loss occurs in color combining prism 1403.

Figure 15:
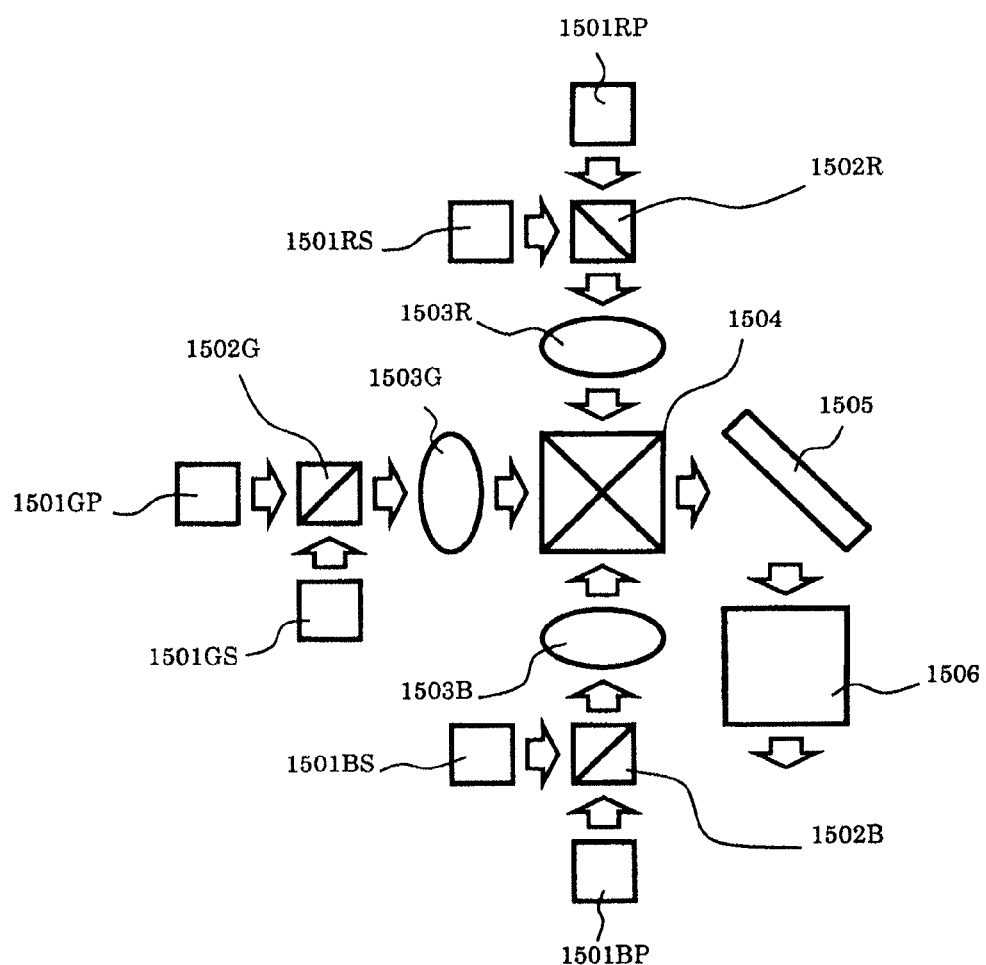
FIG. 15 is a block diagram showing the construction of still another exemplary embodiment of the image display apparatus using the light emitting element in accordance with the present invention.

FIG. 15 is a block diagram showing the construction of still another exemplary embodiment of the image display apparatus using the light emitting element in accordance with the present invention. The image display apparatus in the present exemplary embodiment forms an image by using micromirror device 1505 formed of a plurality of pixels each having a micromirror whose angle is individually controllable.

The image display apparatus shown in FIG. 15 has light source units 1501RP and 1501RS that generate red light, light source units 1501GP and 1501GS that generate green light and light source units 1501BP and 1501BS that generate blue light. Each of these light source units includes four light emitting elements in accordance with the present invention and a rod integrator, as described above with reference to FIG. 11.

Red lights produced in light source unit 1501RP and 1501RS respectively enter polarization beam splitter 1502R as p-polarized light and s-polarized light. Polarization beam splitter 1502R allows the p-polarized light to pass therethrough and reflects the s-polarized light. Thus, the red lights produced in light source unit 1501RP and 1501RS are combined in polarization beam splitter 1502R. The combined red light enters color combining prism 1504 through condenser lens 1503R.

Green lights produced in light source unit 1501GP and 1501GS respectively enter polarization beam splitter 1502G as p-polarized light and s-polarized light. Polarization beam splitter 1502G allows the p-polarized light to pass therethrough and reflects the s-polarized light. Thus, the green lights produced in light source unit 1501GP and 1501GS are combined in polarization beam splitter 1502G. The combined green light enters color combining prism 1504 through condenser lens 1503G.

Blue lights produced in light source unit 1501BP and 1501BS respectively enter polarization beam splitter 1502B as p-polarized light and s-polarized light. Polarization beam splitter 1502B allows the p-polarized light to pass therethrough and reflects the s-polarized light. Thus, the blue lights produced in light source unit 1501BP and 1501BS are combined in polarization beam splitter 1502B. The combined blue light enters color combining prism 1504 through condenser lens 1503B.

Light source unit 1501RP and 1501RS, light source unit 1501GP and 1501GS and light source unit 1501BP and 1501BS can be controlled so that the respective color lighting states are successively changed. Red light, green light and blue light are successively applied from color combining prism 1504 to micromirror device 1505.

Micromirror device 1505 displays images according to the colors that are applied one after another. Red image light, green image light and blue image light produced in micromirror device 1505 are thereby projected onto the screen one after another through projection lens 1506.

If the polarizations of the lights exiting from the light source units are not uniform, the luminance cannot be increased even though the number of light source units is doubled in comparison with an image display apparatus of the construction shown in FIG. 14, because an optical loss of 50% occurs in the polarization beam splitters.

In contrast, in the case where the lights exiting from the light source units are linearly polarized lights, the luminance can be doubled as a result of doubling the number of light source units in comparison with an image display apparatus of the construction shown in FIG. 14, since an optical loss of 50% does not occur in polarization beam splitters.

Figure 16:
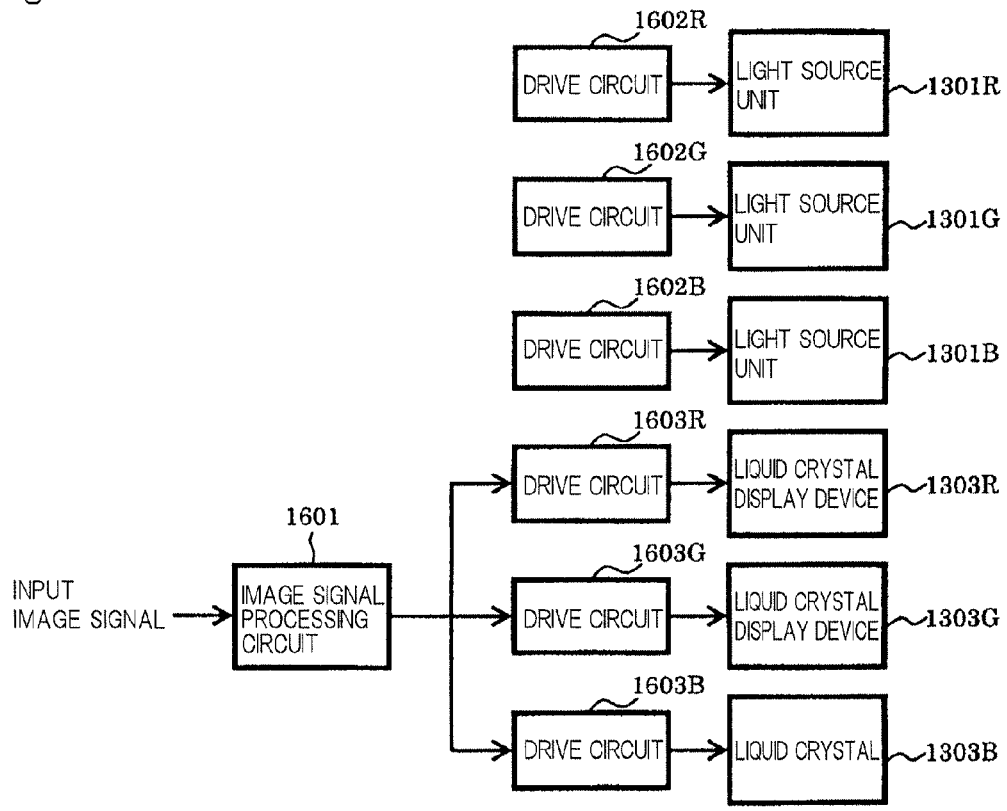
FIG. 16 is a diagram showing the configuration of a drive system for the image display apparatus shown in FIG. 13.

FIG. 16 is a diagram showing the configuration of a drive system for the image display apparatus shown in FIG. 13.

Drive circuits 1602R, 1602G, and 1602B respectively drive light source units 1301R, 1301G, and 1301B. Light source units 1301R, 1301G, and 1301B are thereby maintained always in the lighting state during image display operation. Light source units 1301R, 1301G, and 1301B may alternatively be driven by one drive circuit.

Image signal processing circuit 1601 produces signals for displaying a red image, a green image and blue image according to an input image signal supplied from an external personal computer (PC), an image reproduction apparatus or the like, and supplies the signals to drive circuits 1603R, 1603G, and 1603B.

Drive circuits 1603R, 1603G, and 1603B respectively drive liquid crystal display devices 1303R, 1303G, and 1303B by the signals supplied from image signal processing circuit 1601. Liquid crystal display devices 1303R, 1303G, and 1303B thereby display the red image, the green image and the blue image, respectively.

Figure 17:
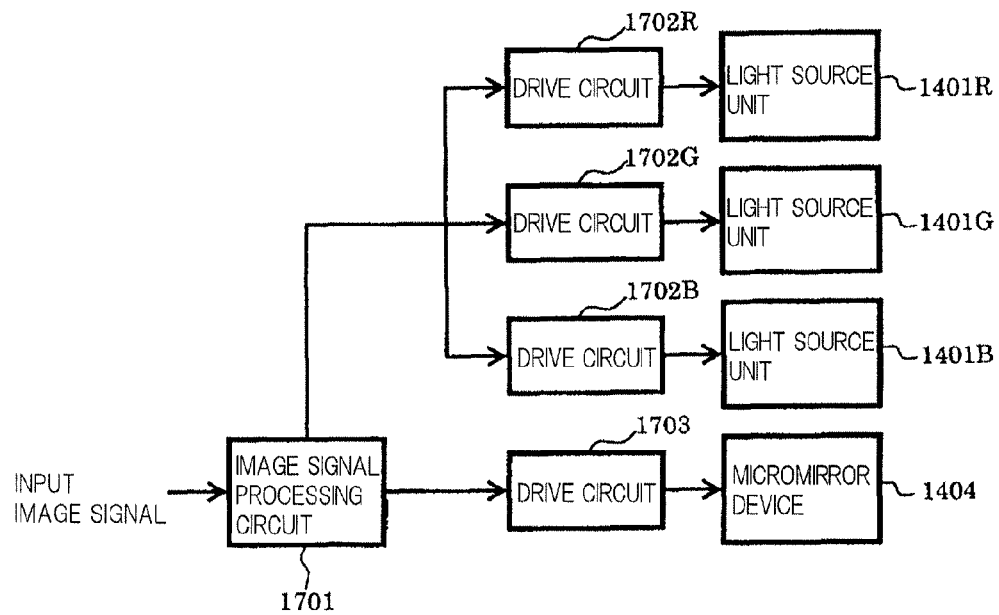
FIG. 17 is a diagram showing the configuration of a drive system for the image display apparatus shown in FIG. 14.

FIG. 17 is a diagram showing the configuration of a drive system for the image display apparatus shown in FIG. 14.

Image signal processing circuit 1701 produces signals for displaying a red image, a green image and blue image according to an input image signal supplied from an external PC, an image reproduction apparatus or the like, and supplies the signals one after another to drive circuit 1703.

Simultaneously with supplying the signal for displaying the red image to drive circuit 1703, image signal processing circuit 1701 produces a signal for producing red light and supplies this signal to drive circuit 1702R. Simultaneously with supplying the signal for displaying the green image to drive circuit 1703, image signal processing circuit 1701 produces a signal for producing green light and supplies this signal to drive circuit 1702G. Simultaneously with supplying the signal for displaying the blue image to drive circuit 1703, image signal processing circuit 1701 produces a signal for producing blue light and supplies this signal to drive circuit 1702B.

Drive circuit 1703 drives micromirror device 1404 by the signals supplied from image signal processing circuit 1701. Micromirror device 1404 thereby displays the red image, the green image and the blue image one after another.

Drive circuits 1702R, 1702G, and 1702B respectively drive light source units 1401R, 1401G, and 1401B by the signals supplied from image signal processing circuit 1701. Light source unit 1401R is thereby lighted when micromirror device 1404 displays the red image; light source unit 1401G is lighted, when micromirror device 1404 displays the green image; and light source unit 1401B is lighted, when micromirror device 1404 displays the blue image.

Figure 18:
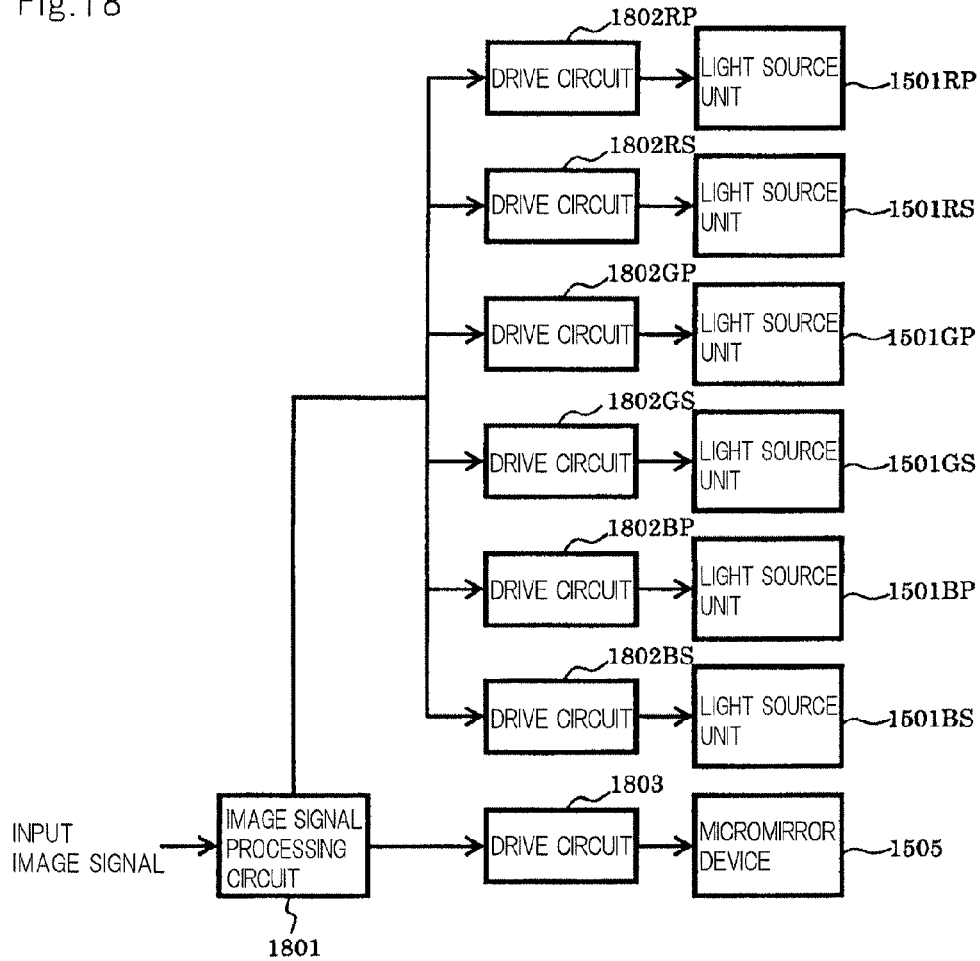
FIG. 18 is a diagram showing the configuration of a drive system for the image display apparatus shown in FIG. 15.

FIG. 18 is a diagram showing the configuration of a drive system for the image display apparatus shown in FIG. 15.

Image signal processing circuit 1801 produces signals for displaying a red image, a green image and blue image according to an input image signal supplied from an external PC, an image reproduction apparatus or the like, and supplies the signals one after another to drive circuit 1803.

Simultaneously with supplying the signal for displaying the red image to drive circuit 1803, image signal processing circuit 1801 produces a signal for producing red light and supplies this signal to drive circuits 1802RP and 1802RS. Simultaneously with supplying the signal for displaying the green image to drive circuit 1803, image signal processing circuit 1801 produces a signal for producing green light and supplies this signal to drive circuits 1802GP and 1802GS. Simultaneously with supplying the signal for displaying the blue image to drive circuit 1803, image signal processing circuit 1801 produces a signal for producing blue light and supplies this signal to drive circuits 1802BP and 1802BS.

Drive circuit 1803 drives micromirror device 1505 by the signals supplied from image signal processing circuit 1801. Micromirror device 1505 thereby displays the red image, the green image and the blue image one after another.

Drive circuits 1802RP, 1802RS, 1802GP, 1802GS, 1802BP, and 1802BS respectively drive light source units 1501RP, 1501RS, 1501GP, 1501GS, 1501BP, and 1501BS by the signals supplied from image signal processing circuit 1801. Light source unit 1501RP and 1501RS are thereby lighted when micromirror device 1505 displays the red image; light source units 1501GP and 1501GS are lighted, when micromirror device 1505 displays the green image; and light source units 1501BP and 1501BS are lighted, when micromirror device 1505 displays the blue image.

This application is based upon and claims the benefit of priority from prior Japanese Patent Application No. 2010-054428, filed on Mar. 11, 2010; the entire contents of which are incorporated herein by reference.

REFERENCE SIGNS LIST

100 Light emitting element
101 Sub-mount
102 P-type electrode
103 Reflective layer
104 P-type semiconductor layer
105 Active layer
106 N-type semiconductor layer
107 N-type electrode
108 Polarizer layer
109 half-wave plate layer Claims

The invention claimed is:

1. A light emitting element having an active layer that produces light, the light emitting element comprising:
 a polarizer layer having a first region that allows a polarization component in a first direction in the light produced in the active layer to pass therethrough and reflects other polarization components, and a second region that allows a polarization component in a second direction perpendicular to the first direction to pass therethrough and reflects other polarization components;
 a wave plate layer having a third region and a fifth region that the light exiting from the first region enters, and a fourth region and a sixth region that the light exiting from the second region enters, the wave plate layer causing the lights that have entered the third to sixth regions to exit as lights in the same polarized state; and
 a reflective layer that reflects the lights reflected by the first region and the second region,
 wherein the directions of optical axes of the third region and the fifth region or the fourth region and the sixth region are perpendicular to each other.

2. An image display apparatus using the light emitting element according to claim 1.

3. The light emitting element according to claim 1, wherein each of the third region and the fifth region allows the incident light to exit without giving a polarization rotation angle to the light; the fourth region allows the incident light to exit while giving a polarization rotation angle of 90 degrees to the light; and the sixth region allows the incident light to exit while giving a polarization rotation angle of 270 degrees to the light.

4. An image display apparatus using the light emitting element according to claim 3.

5. The light emitting element according to claim 1, wherein the third region allows the incident light to exit while giving a predetermined polarization rotation angle to the light; the fifth region allows the incident light to exit while giving the light a polarization rotation angle determined by adding 180 degrees to the polarization rotation angle given by the third region; the fourth region allows the incident light to exit while giving the light a polarization rotation angle determined by adding 90 degrees to the polarization rotation angle given by the third region; and the sixth region allows the incident light to exit while giving the light a polarization rotation angle determined by adding 270 degrees to the polarization rotation angle given by the third region.

6. An image display apparatus using the light emitting element according to claim 5.

7. The light emitting element according to claim 1, wherein the first region and the second region and the third to sixth regions are disposed in the form of strips adjacent one to another.

8. The light emitting element according to claim 7, wherein each of the third region and the fifth region allows the incident light to exit without giving a polarization rotation angle to the light; the fourth region allows the incident light to exit while giving a polarization rotation angle of 90 degrees to the light; and the sixth region allows the incident light to exit while giving a polarization rotation angle of 270 degrees to the light.

9. The light emitting element according to claim 7, wherein the third region allows the incident light to exit while giving a predetermined polarization rotation angle to the light; the fifth region allows the incident light to exit while giving the light a polarization rotation angle determined by adding 180 degrees to the polarization rotation angle given by the third region; the fourth region allows the incident light to exit while giving the light a polarization rotation angle determined by adding 90 degrees to the polarization rotation angle given by the third region; and the sixth region allows the incident light to exit while giving the light a polarization rotation angle determined by adding 270 degrees to the polarization rotation angle given by the third region.

10. An image display apparatus using the light emitting element according to claim 7.

11. The light emitting element according to claim 1, wherein the first region and the second region and the third to sixth regions are disposed adjacent one to another in a staggered fashion.

12. The light emitting element according to claim 11, wherein each of the third region and the fifth region allows the incident light to exit without giving a polarization rotation angle to the light; the fourth region allows the incident light to exit while giving a polarization rotation angle of 90 degrees to the light; and the sixth region allows the incident light to exit while giving a polarization rotation angle of 270 degrees to the light.

13. The light emitting element according to claim 11, wherein the third region allows the incident light to exit while giving a predetermined polarization rotation angle to the light; the fifth region allows the incident light to exit while giving the light a polarization rotation angle determined by adding 180 degrees to the polarization rotation angle given by the third region; the fourth region allows the incident light to exit while giving the light a polarization rotation angle determined by adding 90 degrees to the polarization rotation angle given by the third region; and the sixth region allows the incident light to exit while giving the light a polarization rotation angle determined by adding 270 degrees to the polarization rotation angle given by the third region.

14. An image display apparatus using the light emitting element according to claim 11.

* * * * *